(12) United States Patent
Negru

(10) Patent No.: US 11,855,474 B2
(45) Date of Patent: Dec. 26, 2023

(54) BATTERY CHARGING METHOD AND SYSTEM

(71) Applicant: Dialog Semiconductor (UK) Limited, London (GB)

(72) Inventor: Sorin Laurentiu Negru, San Jose, CA (US)

(73) Assignee: Dialog Semiconductor (UK) Limited, London (GB)

( * ) Notice: Subject to any disclaimer, the term of this patent is extended or adjusted under 35 U.S.C. 154(b) by 498 days.

(21) Appl. No.: 17/213,862

(22) Filed: Mar. 26, 2021

(65) Prior Publication Data
US 2022/0311260 A1 Sep. 29, 2022

(51) Int. Cl.
*H02J 7/00* (2006.01)
*G01R 19/00* (2006.01)
*H02J 7/04* (2006.01)

(52) U.S. Cl.
CPC ...... *H02J 7/00711* (2020.01); *G01R 19/0084* (2013.01); *H02J 7/0013* (2013.01); *H02J 7/00714* (2020.01); *H02J 7/04* (2013.01)

(58) Field of Classification Search
CPC .................................................. H02J 7/00711
USPC ....................................................... 320/139
See application file for complete search history.

(56) References Cited

U.S. PATENT DOCUMENTS

| | | | |
|---|---|---|---|
| 6,137,265 A * | 10/2000 | Cummings | .......... H02J 7/00711 320/133 |
| 8,134,342 B2 | 3/2012 | Labrunie et al. | |
| 8,368,357 B2 | 2/2013 | Ghantous et al. | |
| 8,896,272 B2 | 11/2014 | Hawawini et al. | |
| 8,917,062 B2 | 12/2014 | Lu et al. | |

(Continued)

FOREIGN PATENT DOCUMENTS

| CN | 103490110 A | 1/2014 |
|---|---|---|
| CN | 107134816 A | 9/2017 |

(Continued)

OTHER PUBLICATIONS

"Built-in Resistance Compensation (BRC) Technique for Fast Charging Li-Ion Battery Charger," by Chia-Hsiang Lin et al., IEEE 2008 Custom Integrated Circuits Conference (CICC), Sep. 21-24, 2008, pp. 33-36.

*Primary Examiner* — Yalkew Fantu
(74) *Attorney, Agent, or Firm* — Saile Ackerman LLC; Stephen B. Ackerman

(57) ABSTRACT

A method of charging a battery having a first voltage and a second voltage. In a first phase, applying a constant current to the battery; in a second phase, applying current pulses to the battery; repeating iteratively sampling the first voltage during a current pulse to obtain a measurement of the first voltage; sampling the first voltage during a current pause to obtain a measurement of the second voltage; generating a dynamic reference voltage based on the fixed reference voltage and on a difference between the measurement of the first voltage and the second voltage. There is a comparing the measurement of the first voltage with the dynamic reference voltage. There is a stopping of the current pulses when the measurement of the first voltage is equal to the dynamic reference voltage and the measurement of the second voltage is equal to the fixed reference voltage.

18 Claims, 9 Drawing Sheets

(56) References Cited

U.S. PATENT DOCUMENTS

| | | | |
|---|---|---|---|
| 11,745,621 B2* | 9/2023 | Youn | B60L 58/13 |
| | | | 320/132 |
| 2004/0090209 A1* | 5/2004 | Nishida | H02J 7/007182 |
| | | | 320/149 |
| 2006/0113966 A1 | 6/2006 | Chen | |
| 2013/0181522 A1 | 7/2013 | Wang et al. | |
| 2016/0020618 A1 | 1/2016 | Yang et al. | |
| 2016/0336763 A1 | 11/2016 | Khandelwal et al. | |
| 2018/0337541 A1* | 11/2018 | Eftimie | H02J 7/00 |

FOREIGN PATENT DOCUMENTS

| | | |
|---|---|---|
| EP | 0 311 460 | 10/1989 |
| EP | 0 660 974 B1 | 10/1997 |
| EP | 2 164 152 A2 | 3/2010 |
| EP | 2 276 139 B1 | 11/2017 |
| WO | 92/16991 A1 | 10/1992 |

* cited by examiner

BATTERY CHARGING METHOD AND SYSTEM

TECHNICAL FIELD

The present disclosure relates to methods and systems for charging a battery and in particular to methods and systems for charging a battery quickly.

BACKGROUND

Batteries may comprise one or more battery cells which are generally provided within a battery pack and are responsible for generating and storing the electrical energy provided by the battery.

Rechargeable batteries are available in many different shapes and sizes and with several different combinations of electrode and electrolytes materials. In particular, lithium-ion batteries (or Li-ion batteries) are becoming increasingly popular for a variety of applications, including but not limited to portable electronic devices, electric vehicles, military and aerospace applications.

It is known that batteries may be modeled as an equivalent capacitance ($C_B$) in series with an equivalent internal resistance ($R_1$; hereinafter also referred to as internal resistance for brevity). The internal resistance may be due for example to the resistivity of the component materials and/or to electrochemical factors such as electrolyte conductivity, ion mobility, speed of electrochemical reaction and electrode surface area. The equivalent capacitance and internal resistance of a battery are dependent on various battery parameters and vary dynamically. For example, $C_B$ and $R_1$ may depend on the size, state of charge, chemical properties, age, temperature, and discharge or charge current of the battery.

It is important that batteries are not charged up to, or with a voltage which exceeds the maximum safe voltage sustainable by the battery. The maximum safe voltage depends on the specific type of battery and is generally indicated by manufacturers. For example, for lithium-ion batteries it is typically around 4.2 V. Charging a battery with voltages or currents which exceeds the maximum safe values indicated by manufacturers may cause serious hazards, such as explosions, fires and permanent damage to the battery. Hence, due to this safety issue there is limited scope for shortening the charging time of a battery, since it would not be safe to provide a voltage higher than the maximum safe voltage.

Existing methods for charging batteries, and in particular methods for charging Li-Ion batteries, generally include three charging phases:

1) a so-called "trickle charge" phase, or "wake-up charge" or "pre-charge" phase, in which a small pulsed current is applied to the battery in order to raise the battery voltage from deep depletion (usually around 2.5 V) to a normal depletion state (usually around 3.0 V);
2) a constant-current (CC) phase, in which a large constant current is applied to the battery, usually bringing the battery from around 3.0 V to a voltage around the battery maximum safe voltage indicated by manufacturers (e.g. 4.2 V);
3) a constant-voltage (CV) phase, in which a constant voltage equal to the maximum safe voltage indicated by manufacturers (e.g. 4.2 V) is applied to the battery until the charging current drops at or near values in the 10 mA-100 mA range.

The main disadvantage of the above charging methods is that they require a long charging time. Under constant voltage mode the charging current naturally drops towards zero exponentially, therefore the charging current never truly drop to exactly zero. The charging is artificially interrupted when the charging current drops at a level of 10 mA-100 mA. This leads to long charging times. Moreover, it is known that when current is flowing through a battery, a small voltage drop is caused by the battery internal resistance, hence the voltage across the battery cell is actually lower than the voltage across the terminals of the battery pack. Artificially stopping the charging when the charging current has dropped to a predetermined value means that the voltage drop across the internal battery resistance may not be properly accounted for.

Whilst options for shortening the trickle charge phase and constant current phase have been proposed, the main problem remains how to shorten the constant voltage phase. During the CV phase, the rate of charging is dictated by battery intrinsic parameters, such as the battery equivalent capacitance ($C_B$) and the battery internal resistance ($R_I$) and therefore only limited time savings can be achieved.

In order to achieve fast charging, a commonly used approach is to accelerate the constant current phase by increasing the charging current applied to the battery. However, this approach has the significant disadvantage of reducing battery life. Most battery manufacturers advise against using high charging currents for extended periods of time. Moreover, higher charging current generally require larger silicon area, which may increase the cost and size of the charger and therefore is undesirable.

Another option is to charge the battery with a voltage above the nominal voltage recommended by manufacturer (e.g. 4.2 V) in order to speed up charging during the constant voltage phase. Systems employing this approach typically use a predetermined voltage value based on battery parameters to generate a new reference voltage for the constant voltage phase which exceeds the nominal voltage (e.g. 4.2 V). However, this new reference voltage is determined prior to the start of charging and is a fixed parameter which does not take into account the dynamic nature of battery parameters such as temperature or internal resistance, which vary as the battery charge state varies. Hence, these charging systems are a source of safety concern and are also unable to determine whether the battery has truly reached its full charge.

Other prior art methods for charging batteries aim at accelerating charging by using a pulsed current. For example, patent U.S. Pat. No. 6,137,265 teaches using a train of current pulses for charging a battery. However, the method disclosed in this patent application uses a fixed reference voltage (specifically the nominal voltage provided by the manufacturer), to determine when the battery is fully charged. Moreover, in order to prevent the battery cell exceeding said fixed reference voltage and avoid any safety issues, the amplitude of the current pulses is decreased as the battery approaches full charge. Hence, this charging method clearly does not guarantee that the battery cell is fully charged when the charging is stopped; and it only achieves limited acceleration of the charging because the amplitude of the current pulses is decreased as the battery approaches full charge.

Therefore, conventional fast charging methods require a trade-off between achieving a high speed of charging and one or more of: reducing battery life, increasing a risk of safety issues and stopping the charging before the battery reaches full charge. It would be desirable to provide a method which allows to stop charging exactly when the battery achieves full charge, whilst at the same time maximizing charging speed, eliminating safety concerns and minimizing the battery size.

SUMMARY

It is an object of the disclosure to address one or more of the above-mentioned limitations.

According to a first aspect of the disclosure there is provided a method of charging a battery having a first voltage and a second voltage, the method comprising: in a first phase, applying a constant current to the battery; in a second phase, applying current pulses to the battery, the current pulses being separated by a current pause during which the current is at or close to zero; providing a fixed reference voltage; repeating iteratively sampling the first voltage during a current pulse to obtain a measurement of the first voltage; sampling the first voltage during a current pause to obtain a measurement of the second voltage; generating a dynamic reference voltage based on the fixed reference voltage and on a difference between the measurement of the first voltage and the measurement of the second voltage; comparing the measurement of the first voltage with the dynamic reference voltage; and the method comprising stopping applying the current pulses when at least one of the measurement of the first voltage is equal to the dynamic reference voltage and the measurement of the second voltage is equal to the fixed reference voltage.

For instance, the first voltage may be a battery pack voltage and the second voltage may be a battery cell voltage.

Optionally, the method further comprises iteratively comparing the measurement of the second voltage with the fixed reference voltage.

Optionally, the battery comprises a battery pack and the first voltage is a voltage of the battery pack.

Optionally, the battery pack comprises an equivalent battery capacitance and an equivalent internal resistance in series within the battery pack.

Optionally, the battery pack further comprises a circuit board protection resistance; and the internal resistance comprises a cell internal resistance and a protection circuit board resistance.

Optionally, the equivalent battery capacitance and the equivalent internal resistance vary during the charging of the battery.

Optionally, the dynamic reference voltage is the sum of the fixed reference voltage and a dynamic error voltage, the dynamic error voltage being determined as the difference between the last measurement of the first voltage and the last measurement of the second voltage.

Optionally, iteratively sampling the first battery voltage during a current pause comprises one of sampling the first battery voltage during each current pause; and sampling the first battery voltage during the first available current pause after a predetermined time interval has lapsed.

Optionally, the current pulses have a constant profile.

Optionally, the constant profile is a square profile.

Optionally, the square profile has a constant duty cyle.

Optionally, the duty cycle is equal or greater than 0.9.

Optionally, the amplitude of the current pulses is equal to an amplitude of the constant current applied to the battery during the first phase.

Optionally, the duration of the current pauses is selected based on a relaxation time of the battery.

Optionally, the current pauses have a duration of about 1 ms to about 10 ms.

Optionally, the current pulses have a duration of about 10 about to around 60 seconds.

Optionally, the duration of the current pulses is selected based on an average time required for the dynamic error voltage to vary by a predetermined amount.

Optionally, the method further comprises: applying a pulsed current to the battery prior to the first phase, upon identifying that the battery is fully depleted.

Optionally, the battery is a lithium-ion battery.

Optionally, the fixed reference voltage corresponds to a maximum voltage that can be safely applied to the battery.

According to a second aspect of the disclosure there is provided a charger for charging a battery having a first voltage and a second voltage, the charger comprising a current generator configured to provide a current to the battery; a voltage sensor configured to sample the first battery voltage; and a controller configured to: in a first phase, apply a constant current to the battery via the current generator; in a second phase, apply current pulses to the battery via the current generator, the current pulses being separated by a current pause during which the current is at or close to zero; prove a fixed reference voltage; repeat iteratively sampling the first voltage via the voltage sensor during a current pulse to obtain a measurement of the first voltage; sampling the first voltage via the voltage sensor during a current pause to obtain a measurement of the second voltage; generating a dynamic reference voltage based on the fixed reference voltage and on a difference between the measurement of the first voltage and the measurements of the second voltage; comparing the measurement of the first voltage with the dynamic reference voltage; and the controller being configured to stop applying the current pulses when at least one of the measurement of the first voltage is equal to the dynamic reference voltage and the measurement of the second voltage is equal to the fixed reference voltage.

Optionally, the dynamic reference voltage is the sum of the fixed reference voltage and a dynamic error voltage, the dynamic error voltage being determined as the difference between the last measurement of the first voltage and the last measurement of the second voltage.

Optionally, the charger comprises a sample-and-hold circuit being operable in one of a first state and a second state; and the controller is further configured to control the sample-and-hold circuit such that during a current pause, the sample-and-hold circuit is in the first state; and during a current pulse the sample-and-hold circuit is in the second state.

Optionally, the sample-and-hold circuit is an analog circuit.

Optionally, the sample-and-hold circuit comprises a comparator having an output coupled to the controller; and the sample-and-hold circuit is configured such that in the first state, the output of the comparator is based on a comparison between the measurement of the second voltage and the fixed reference voltage; and in the second state, the output of the comparator is based on a comparison between the measurement of the first voltage and the dynamic reference voltage.

Optionally, the sample-and-hold circuit further comprises a first capacitor, a second capacitor and a first buffer, the first buffer begin coupled between the first and the second capacitor; and a second buffer; wherein the first buffer, the first capacitor and the second capacitor are configured to sample and hold the dynamic error voltage; and the second buffer and the second capacitor are configured to provide to the comparator a sum of the sampled dynamic error voltage and the fixed reference voltage.

The method of the second aspect may also incorporate using or providing features of the first aspect and various other steps as disclosed herein.

According to a third aspect of the disclosure there is provided a device comprising a charger for charging a battery having a first voltage and a second voltage, the charger comprising a current generator configured to provide a current to the battery; a voltage sensor configured to sample the first battery voltage; and a controller configured to: in a first phase, apply a constant current to the battery via the current generator; in a second phase, apply current pulses to the battery via the current generator, the current pulses being separated by a current pause during which the current is at or close to zero; provide a fixed reference voltage; repeat iteratively sampling the first voltage via the voltage sensor during a current pulse to obtain a measurement of the first voltage; sampling the first voltage via the voltage sensor during a current pause to obtain a measurement of the second voltage; generating a dynamic reference voltage based on the fixed reference voltage and on a difference between the measurement of the first voltage and the measurements of the second voltage; comparing the measurement of the first voltage with the dynamic reference voltage; and the controller being configured to stop applying the current pulses when at least one of the measurement of the first voltage is equal to the dynamic reference voltage and the measurement of the second voltage is equal to the fixed reference voltage.

The system of the third aspect may also incorporate using or providing features of the first aspect and of the second aspect and various other steps as disclosed herein.

BRIEF DESCRIPTION OF THE DRAWINGS

The disclosure is described in further detail below by way of example and with reference to the accompanying drawings, in which.

DESCRIPTION

Figure 1B:
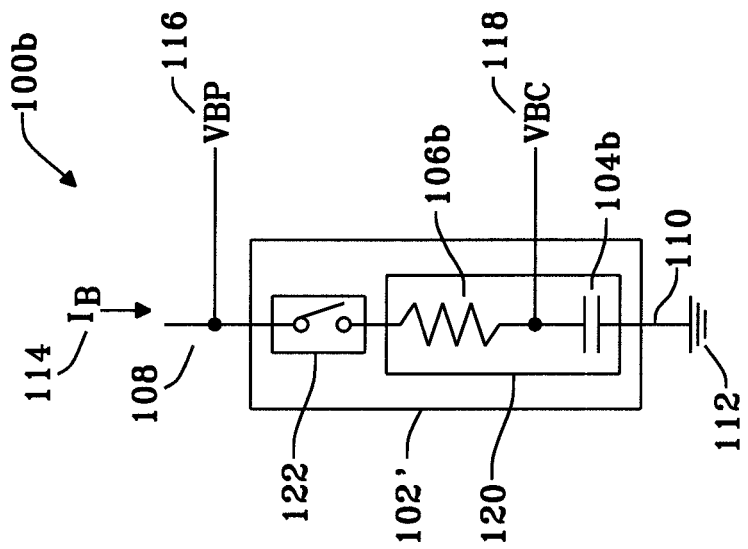
FIG. 1B is a schematic diagram of a battery provided with a battery protection circuit board.
Figure 1A:
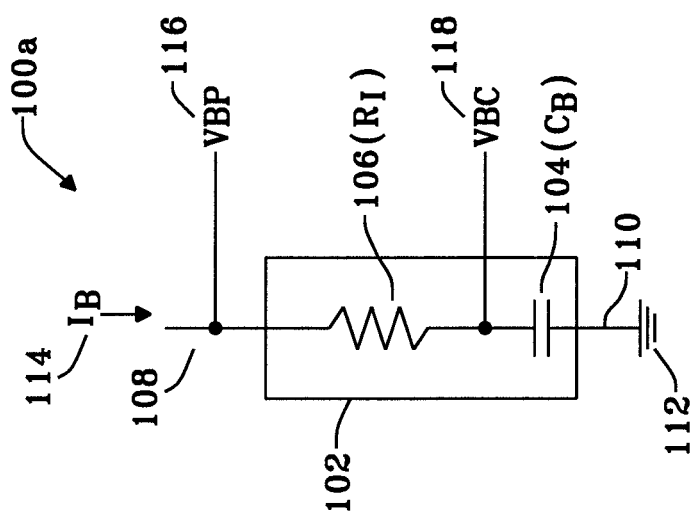
FIG. 1A is a schematic diagram of a battery.

FIG. 1A is a schematic diagram of a battery 100a. The battery 100a comprises an equivalent battery capacitance 104 ($C_B$) in series with an equivalent internal resistance 106 ($R_I$). The equivalent battery cell capacitance and the equivalent internal resistance may not be constant during the charging of the battery. For example, the equivalent internal cell resistance may decrease as the battery charge increase.

The equivalent battery capacitance 104 and the equivalent internal resistance 106 are provided within a battery pack 102 having a first terminal 108 and a second terminal 110. The first terminal 108 is configured to receive a charging current 114 provided by a charger (not shown). The second terminal 110 is connected to a fixed potential. For example, the fixed potential may be a ground potential.

The battery 100a has a battery pack voltage 116 (VBP), which is the voltage across the terminals of the battery pack. The battery pack voltage 116 may be sampled by measuring the voltage across the first terminal 108 and the second terminal 110 of the battery pack 102 or it may be sampled by measuring the voltage of one terminal with respect to a floating voltage. The battery 100a also includes a battery cell voltage 118 (VBC), which is the voltage across the terminals of the equivalent battery capacitance. The battery pack voltage 116 is equivalent to the battery cell voltage 118 if no current is flowing through the battery (open circuit voltage). However, when a current is flowing through the battery, the battery pack voltage VBP is higher than the voltage across the battery equivalent capacitance (closed-circuit voltage). In particular, when a current is flowing through the battery 100a, the battery pack voltage 116 will be given by the sum of the voltage across the battery equivalent capacitance 104 and a voltage drop caused by the battery internal resistance 106.

FIG. 1B is another schematic diagram of a battery 100b wherein the battery 100 is provided with a battery protection board (PCB). Common features between figures in this disclosure are represented by common reference numerals/variables.

In this specific embodiment, the battery pack 102' of the battery 100b comprises a battery cell 120 and a protection circuit board (PCB) 122. The protection circuit board 122 is configured to monitor one or more battery parameters and to disconnect the battery cell(s) 120 from the charger (not shown) whenever an unsafe condition is detected.

The battery cell 120 comprises a cell resistance 106b and a cell capacitance 104b. In this specific embodiment, the internal resistance of the battery 100 is given by a sum of the cell resistance 106b and any protection circuit board resistance, that is, any resistance provided by the PCB 122; while the equivalent battery capacitance 104 is given by the cell capacitance 104b. However, it will be appreciated that the battery 100b may comprise more than one cell and that when several cells are present, each cell will contribute to the battery internal resistance $R_I$ and the battery equivalent capacitance $C_B$. Moreover, other components of the battery, such as electrical wires or casings, may contribute to the internal resistance and capacitance, as will be known to the person skilled in the art.

Generally, it is not possible to directly measure the voltage across the battery cells, since these are located within the battery pack. The only easily accessible voltage is the battery pack voltage VBP.

Figure 2:
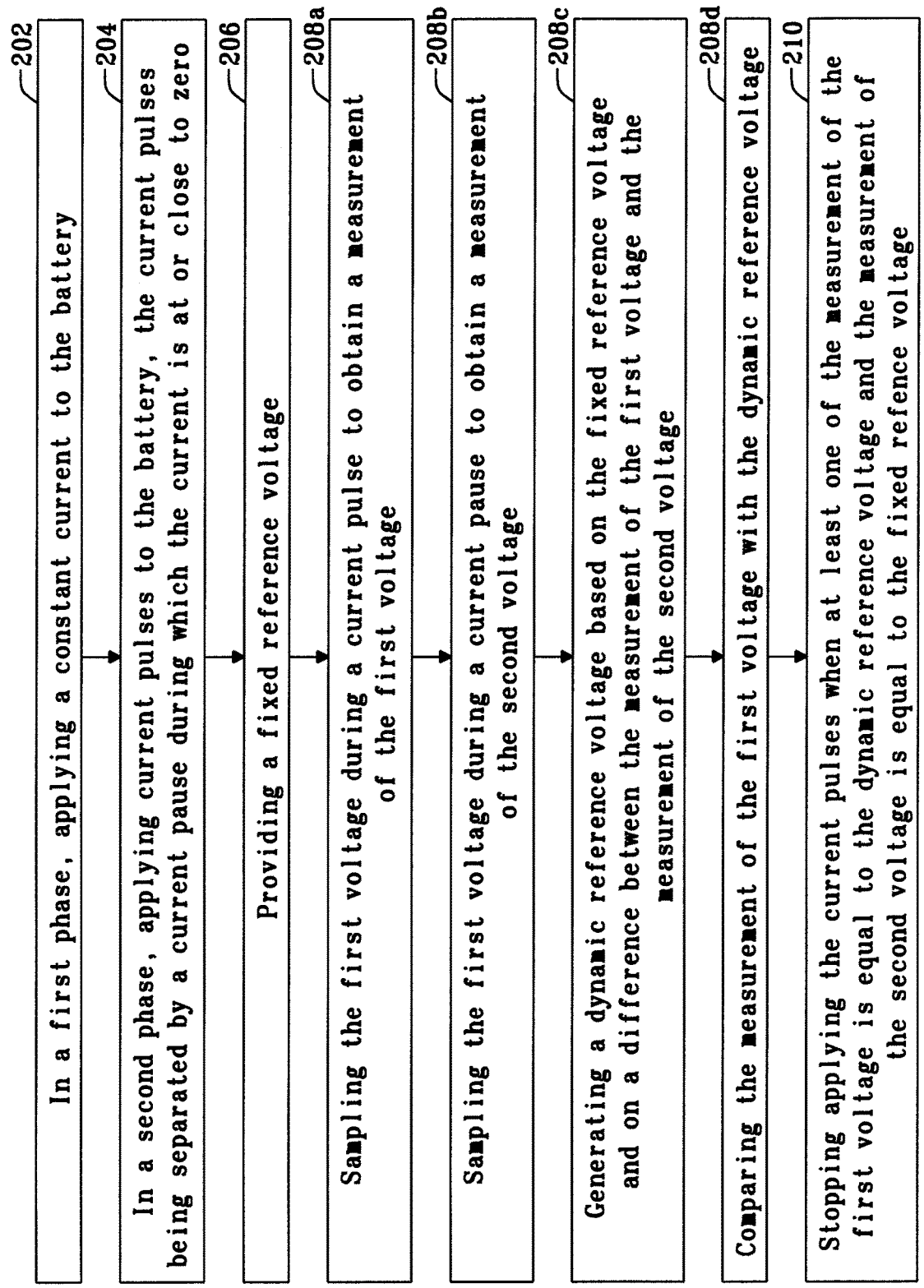
FIG. 2 is a flow chart of a method of charging a battery according to the present disclosure.

FIG. 2 is a flow chart of a method 200 of charging a battery having a first voltage and a second voltage, according to the disclosure. The method 200 comprises a first phase and a second phase. In the first phase a constant current is applied to the battery (step 202). In the second phase current pulses are applied to the battery. The current pulses are separated by a current pause during which the current is at or close to zero (step 204). For instance, during a current pause the current may be less than a predetermined threshold value. At step 206 a fix reference voltage VREF is provided.

Several steps are then repeated iteratively.

At step 208a the first voltage is sampled during a current pulse to obtain a measurement of the first voltage. At step 208b the first voltage is sampled during a current pause to obtain a measurement of the second voltage. At step 208c a dynamic reference voltage (VBPH) is generated based on the fixed reference voltage and on a difference between the measurement of the first voltage and the measurement of the second voltage. At step 210d the measurement of the first voltage is compared with the dynamic reference voltage.

The steps 208a through 208d are repeated iteratively until one of the following conditions is met.

At step 210 the current pulses cease to be applied when at least one of the measurement of the first voltage is equal to the dynamic reference voltage and the measurement of the second voltage is equal to the fixed reference voltage.

The method 200 may be used for example for charging the battery 100, the first voltage being the battery pack voltage 116 and the second voltage being the battery cell voltage 118. When the current through the battery is zero, sampling the battery pack voltage 116 provides a measurement of the battery cell voltage 118. When a charging current is flowing through the battery, the battery cell voltage 118 is equal to the battery pack voltage minus a voltage drop $\Delta V_{err}$ 304 caused by the internal resistance of the battery $R_I$:

$$VBC=VPB-\Delta V_{err}=VPB-R_I*I_B.$$

The time evolution of the battery pack voltage 116, the battery cell voltage 118 and the dynamic reference voltage when the battery 100 is charged according to the method 200 will now be explained in more details with reference to FIG. 3.

Figure 3:
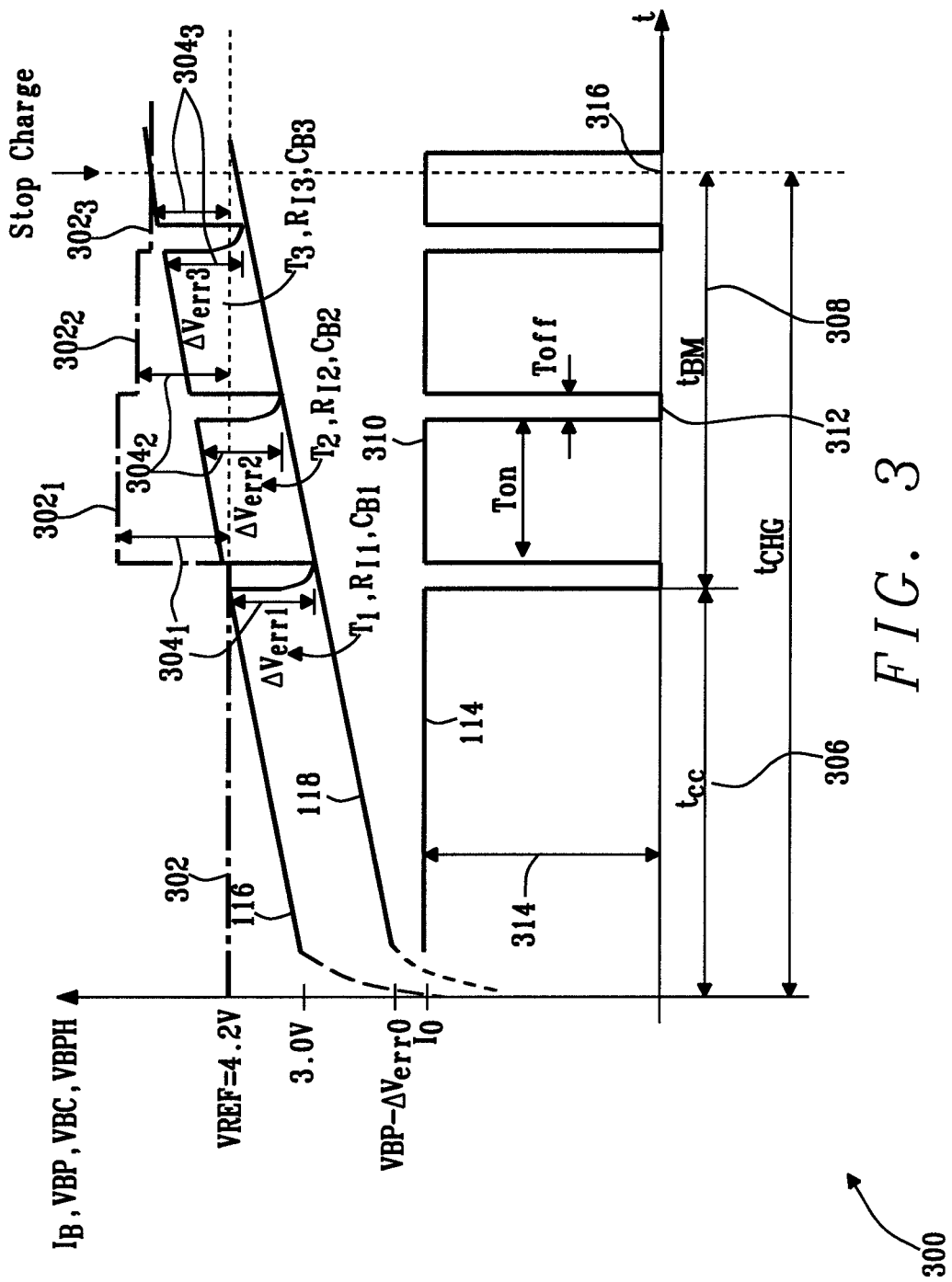
FIG. 3 is a timing diagram illustrating the first phase and the second phase of the method of FIG. 2.

FIG. 3 is a timing diagram 300 showing the operation of the method 200 when applied to the battery 100. The timing diagram 300 shows the battery cell voltage 118 (VBC), the battery pack voltage 116 (VBP) and the charging current 114 ($I_B$). The timing diagram 300 further shows the dynamic reference voltage 302 generated according to the method 200 (step 208c).

In this specific embodiment, the battery 100 has a nominal voltage of 4.2 V, that is the maximum voltage safely applicable to the battery cell is 4.2 V. This is used as fixed reference voltage VREF during the charging.

During the first phase 306 (hereinafter also referred to as constant-current phase or CC phase) a constant charging current $I_0$ is applied to the battery 100; the battery pack voltage 116 is iteratively measured by sampling the battery voltage between the terminals 108 and 110, and the battery pack voltage is iteratively compared with the fixed reference voltage VREF. After a time $t_{CC}$ the battery pack voltage VBP reaches the fixed reference voltage VREF and the second phase 308 is initiated. For example, the first phase may bring the battery pack voltage from 3.0V to 4.2 V, though it will be appreciated that different batteries will have different parameters and hence the first and starting voltage will vary depending on the specific battery to be charged.

During the second phase 308 (hereinafter also referred to as burst-mode or BM phase) a pulsed-current is applied to the battery. The current pulses 310 are each separated from the next pulses by a current pause 312 during which the current is at or close to zero. During the current pulses 310, the battery pack voltage 116 is sampled to obtain a measurement of the battery pack voltage and non-zero current. During the current pauses 312, the battery pack voltage is sampled to obtain a measurement of the battery pack voltage at zero current, which is equivalent to a measurement of the battery cell voltage 118.

Since the objective is to achieve fast charging, in a preferred embodiment, the amplitude of the current pulses 310 is the same as a current amplitude 314 of the charging current in the constant current mode, which is selected such as to optimize charging speed, battery life and safety. Moreover, in a preferred embodiment the current pulses have a constant amplitude and duty cycle throughout the burst mode phase, so that the charging time $t_{CHG}$ is truly minimized. In other embodiments, a different value for the amplitude may be used in the second phase as compared to the first phase and the profile of the current pulses may not be constant.

In a preferred embodiment, the current pauses 312 are provided by dropping the charging current to zero for a period of time Toff. The period Toff may be set to be as short as possible but long enough to permit the sampling of the battery pack voltage at zero current, that is to measure the battery cell voltage. The current is then returned to its maximum amplitude and is maintained constant throughout the charge pulses 310 for a time Ton which is much longer than the time Toff, after which the new current pause is provided. For example, in some embodiments the time Toff may be set to around 1 to 10 ms and Ton may be in the range 10 s-2 min. In a specific embodiment, the method 200 may be configured such that Ton is 10 seconds and Toff is 1 ms. This provides a duty cycle of 0.9999, which means that throughout the burst mode phase the battery 200 is provided with a nearly continuous current, thereby enabling true fast charging.

It will be appreciated that the signals represent in the timing diagram 300 and in other diagrams of the disclosure are not drawn to scale, and that various signals have been magnified to improve clarity.

The battery cell voltage 118 represents the true charge of the battery 100 and should never exceeds the fixed reference voltage VREF (usually 4.2 V for lithium-ion batteries), which is the maximum safe voltage for the battery 100. Hence, the battery charging should ideally be terminated at exactly VBC=VREF. However, the battery cell voltage is not directly accessible, hence the battery pack voltage is sampled throughout charging by iteratively sampling the battery pack voltage 116 at zero current.

At any time throughout the burst mode phase, the dynamic reference voltage VBPH (302) can be computed based on the fixed reference voltage and a difference of the last measurement of the battery pack voltage at non-zero current and the last measurement of the battery at zero-current, which represents the battery cell voltage. In particular, the dynamic reference voltage may be computed as the sum of the fixed reference voltage and a dynamic error voltage $\Delta V_{err}$ 304 equal to the difference between the last available measurement of the battery pack voltage at non-zero current minus the last available measurement of the battery cell voltage (that is, the last measurement of the battery pack voltage at zero current):

$$VBPH=VREF+\Delta V_{err}=VREF+VBP(I_B=I_0)-VBP\ (I_B=0).$$

The error voltage $\Delta V_{err}$ depends on one or more battery parameters. For example, the error voltage $\Delta V_{err}$ may depend on the battery temperature $T_1$, the battery internal resistance $R_I$ and the battery equivalent capacitance $C_B$. Since these parameters vary during the charging, the error voltage $\Delta V_{err}$ and the dynamic reference voltage VBPH also vary during charging. This is reflected in the graph by varying error voltages $304_1$ ($\Delta V_{err1}$), $304_2$ ($\Delta V_{err2}$) and $304_3$ ($\Delta V_{err3}$), which depends respectively on the parameters, ($T_1$, $R_{I1}$, $C_{B1}$), ($T_2$, $R_{I2}$, $C_{B2}$) and ($T_3$, $R_{I3}$, $C_{B3}$), and by the corresponding dynamic reference voltages values $302_1$, $302_2$, $302_3$. In particular, because the internal resistance decreases in time, VBPH decreases as well. At the same time the battery pack voltage increases from one sampling to the next due to the battery continuing to be charged by the charging current $I_B$. These two evolutions will eventually end in reaching each other triggering charge termination at a time tCHG (316).

By iteratively computing the dynamic error voltage 304 ($\Delta V_{err}$) throughout charging, it is ensured that the dynamic reference voltage computed at any time t represents the true voltage drop through the battery internal resistance at the time t, hence the dynamic reference voltage provides a reference to complete the charge at exactly VBC=4.2 V.

During the burst mode phase, the measurements of the battery pack voltage 116 at non-zero current are iteratively monitored and compared with the dynamic reference voltage in order to determine when to stop the charging. The method 200 may further comprise the step of iteratively comparing the battery cell voltage with the fixed reference voltage in order to determine when to stop the charging, such that the charging may be terminated when either the battery pack voltage at non-zero current reaches the dynamic reference voltage, or the battery cell voltage reaches the fixed reference voltage. However, it will be appreciated that since in preferred embodiments Toff is much shorter than Ton, the chance of detecting the battery cell voltage reaching the fixed reference voltage is substantially smaller than the chance of detecting the battery pack voltage measured at non-zero current reaching the dynamic reference voltage.

It will be appreciated that the battery cell voltage may be measured at different time intervals. In some embodiments, a new measurement of the battery cell voltage may be provided at each current pause. In other embodiments, iteratively sampling the battery pack voltage during a current pause may comprise iteratively sampling the battery pack voltage at regular intervals given by a predetermined number of current pauses; or iteratively sampling the battery pack voltage at the first current pause available after a predetermined time interval has lapsed.

The duration of the current pauses and of the current pulses should be selected such as to optimize charging speed, battery life and safety. In some embodiments, the duration of the current pauses is selected based on a relaxation time of the battery. For example, in some embodiments the Toff time may be limited to being at least 1 ms to allow for the charging across the battery to drop to zero or near zero. Selecting a time Toff which is too short and does not allow the current through the battery to drop to or close to zero, may lead to an underestimate of the dynamic reference voltage and hence to an incomplete charge of the battery.

In some embodiments, the duration of the current pulses is selected based on an estimated time taken for the dynamic error voltage to vary from the previously estimated value. For example, the time Ton may be chosen in the range of 10 to 60 seconds. Selecting a Ton time which is too long may lead to missing significant changes in the battery status and therefore to safety issues. With reference to FIG. 3, it can be noted that each dynamic reference voltage value $302_i$ is based on a measurement of the battery cell voltage at the previous current pause. Hence, the dynamic reference voltage does not reflect the battery parameters at exactly the time at which it is computed. However, if the duration of the current pulses is selected to be equal to a known minimum time interval in which the battery parameters are not expected to undergo any significant change, e.g. 10 seconds, then the battery parameters at the time of computing of the dynamic reference voltage can be safely approximated with the battery parameters during the previous current pause. Alternatively, in some embodiments, the time Ton may be gradually reduced, for example from 10 seconds to 1 second, to account for a greater variability of the battery parameters as the battery approaches full charge.

It will be appreciated that in different embodiments of the method 200, some steps may be omitted and/or executed in different order without departing from the scope of the present disclosure and that the stated steps do not preclude the presence or addition of one or more other steps. For example, the method 200 may or may not comprise a trickle charging phase applying a trickle pulsed current to the battery prior to the first phase when the battery is fully depleted, in order to raise the battery voltage from the deep depletion to a normal depletion state.

Moreover, it will be appreciated that although the above figures have been illustrated with a focus on lithium-ion batteries which generally have a nominal voltage of 4.2 V, the method 200 may be used for charging any lithium-ion battery with different nominal voltages, as well as any other types of batteries, such as nickel-cadmium or nickel metal hybrid batteries, to name just a few.

Prior art systems used a predetermined reference voltage (either fixed or dynamic) determined prior to the charging and based on selected battery parameters in order to determine when to stop the charging. However, the selected battery parameters are not guaranteed by manufacturers since they vary during charging. Hence, the use of a predetermined reference voltage is neither safe, (because the battery cell voltage VBC could exceed the maximum safe value of 4.2 V) nor efficient (since the charging may be terminated before the battery cell voltage has reached the full charge value of 4.2 V). The method 200 eliminates the risk of the battery cell voltage VBC exceeding the maximum safe voltage of 4.2 V. It also prevents stopping charging too early, before the battery has achieved full charge. This is achieved by employing a dynamic reference voltage which is constantly updated during charging.

The dynamic reference voltage embodies the dynamic behavior of all critical battery parameters, such as temperature, equivalent internal resistance, equivalent internal capacitance, and provide a true estimate of the maximum voltage safely applicable to the battery at any point during charging.

The use of the dynamic reference voltage which accounts for the true values of the battery parameters in real-time, permits to keep current pulses at constant current amplitude and duty cycle up until the end of the charging whilst not incurring any safety issue. This provides faster charging as compared to prior art methods in which the current pulses amplitude and/or duty cycle are diminished as the current approaches full charge.

Figure 4:
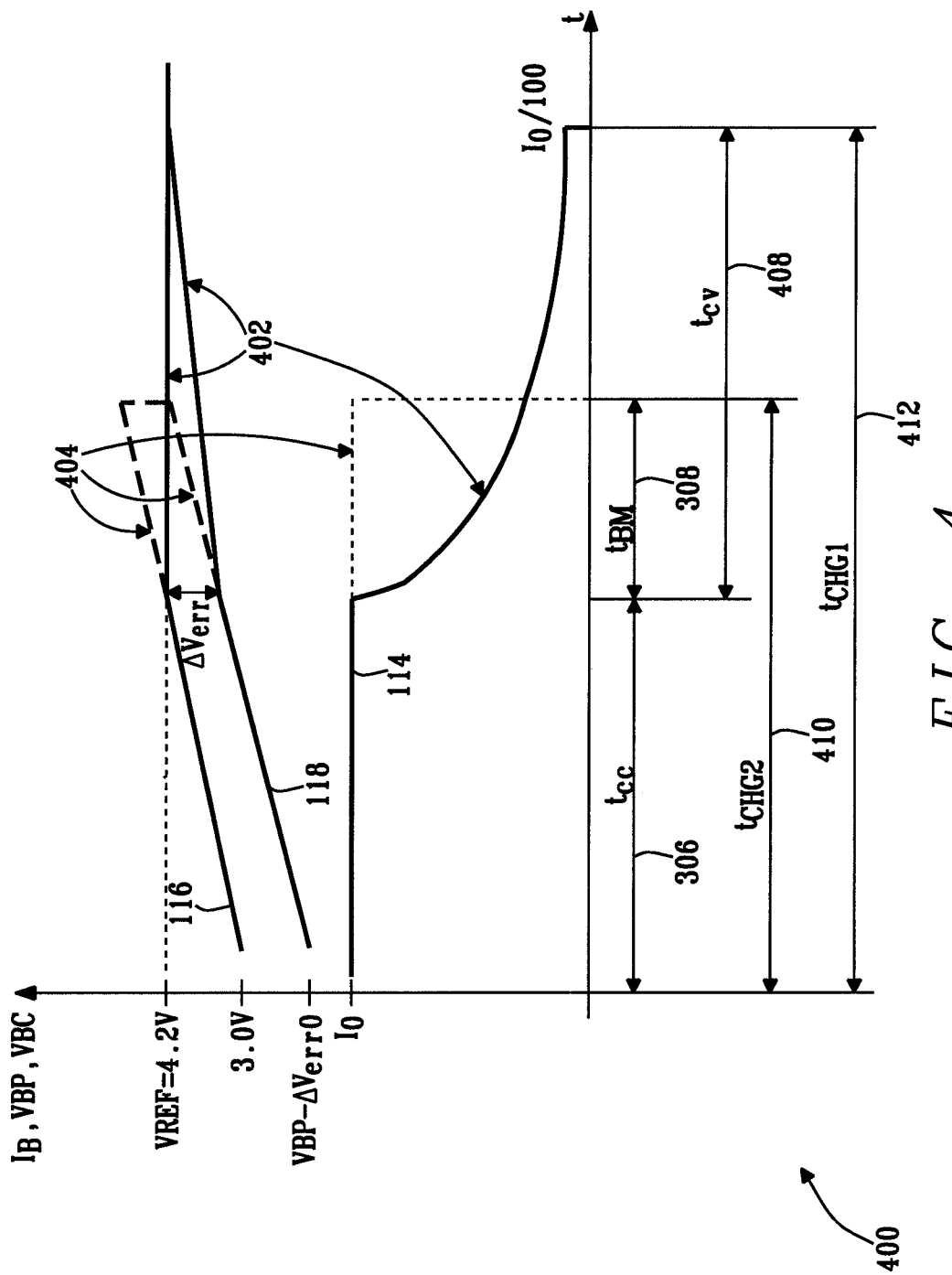
FIG. 4 is a timing diagram comparing a prior charging method with the method of FIG. 2.

The time reduction of the charging provided by the method 200 is illustrated in FIG. 4, which is a timing diagram 400 showing a comparison between a prior charging method and the method 200. Common features between figures in this disclosure are represented by common reference numerals/variables.

The timing diagram 400 shows the evolution of the battery cell voltage 118 (VBC), the battery pack voltage 116 (VBP) and the charging current 114 ($I_B$) during the charging of the battery 100. The continuous lines 402 correspond to a scenario in which the battery 100 is charged according to a prior art charging method which comprises a constant current phase 306 followed by a constant voltage phase 408.

The dashed lines 404 correspond to a scenario in which the battery 100 is charged according to the method 200.

During the first phase 306, both the prior art method and the method 200 employ a constant DC charging current and monitor the battery pack voltage to determine when it reaches the nominal voltage value of 4.2 V. Thereafter, the method according to the prior art implements a constant voltage phase 408 during which the battery pack voltage is maintained at 4.2 V. Throughout this phase, the charging current 114 is regularly monitored and the charging is terminated when the charging current reaches zero or a value close to zero (typically in the range of 10 mA-100 mA).

The method 200 instead implements the burst mode phase 308 as previously described with reference to FIG. 2 and FIG. 3, after the first phase is terminated. If the duration Toff of the current pauses during the burst mode phase 308 is selected such that it is much shorter than the current pulse duration Ton, then the burst mode can be approximated with a continuous current phase up until the end of the charging. As a result, the time 410 (tCHG2) for fully charging the battery 100 according to the method 200 is much shorter than the conventional time 412 (tCHG1) required for fully charging the battery 100 according to the prior art. In some embodiments, the time duration tBM of the burst mode phase 308 for charging the battery in burst mode according to the method 200 may be estimated as $tBM=C_B*R_I$ and the duration tCV of the constant voltage phase 408 for charging the battery in constant voltage mode according to the prior art may be estimated as $tCV=C_B*R_I*2*\ln(10)$. Hence, the time necessary to complete the charging after the constant current phase may be 4.6 times shorter when using the method 200 as compared to prior art methods employing a constant voltage phase It will be appreciated that one or more steps of the method 200 may be implemented via a computer implemented method.

Figure 5:
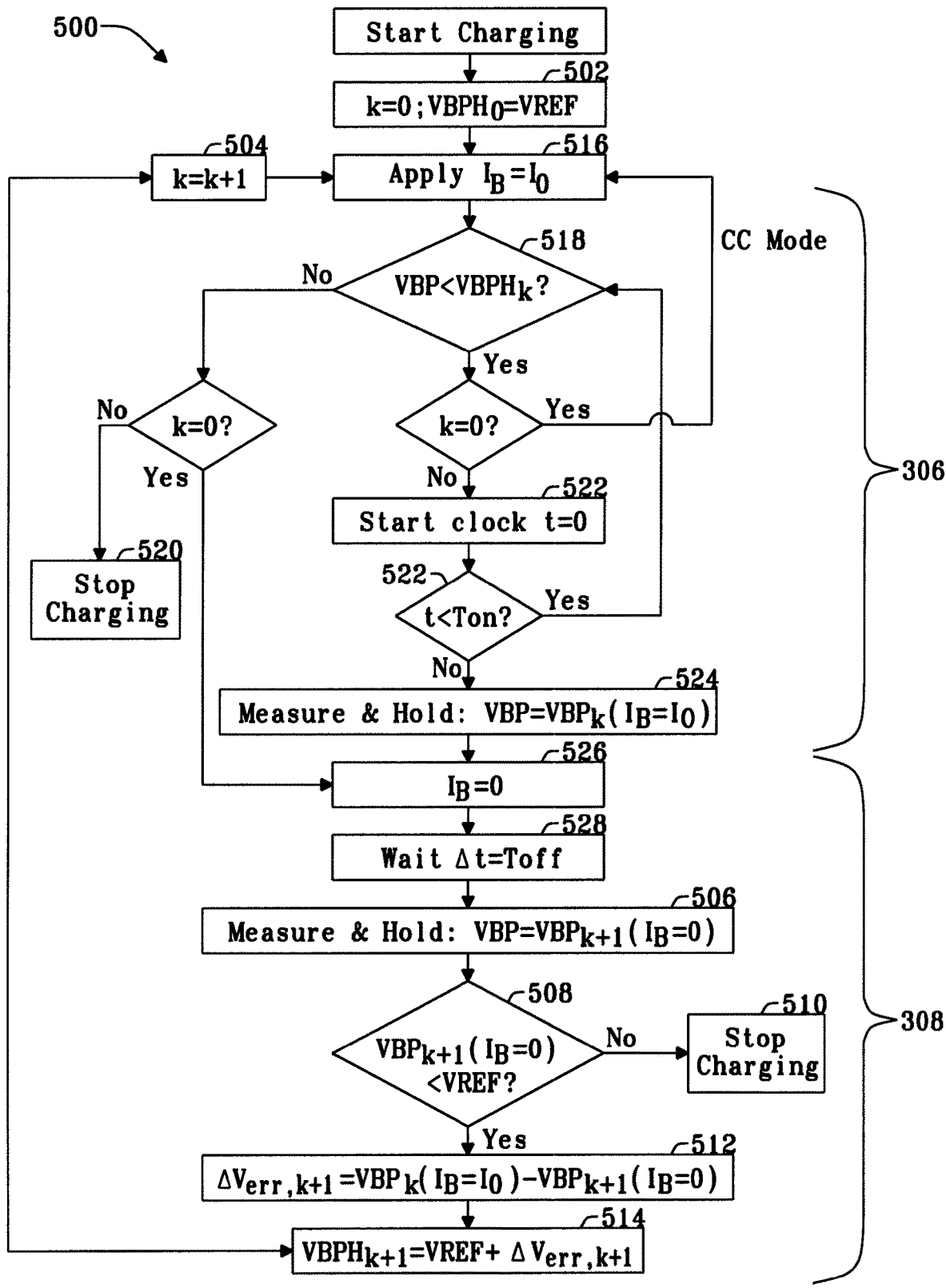
FIG. 5 is a schematic diagram of a computer-implemented method for charging a battery, in accordance with a specific embodiment of the method of FIG. 2.

FIG. 5 is a flow chart of a computer-implemented method 500 for charging a battery, in accordance with a specific embodiment of the method 200. The computer-implemented method 500 provides steps for implementing a constant current phase 306, in which a large constant current is applied to the battery; and a burst mode phase 308, in which a pulsed current is applied to the battery.

An index k is initialized at step 502 and incremented after each current pause (step 504). At the end of each current pause a measurement $VBP_{k+1}(I_B=0)$ is obtained by sampling the battery pack voltage (step 506) and compared with the fixed reference voltage VREF (step 508). If the battery pack voltage at non-zero current has reached the fixed reference voltage, the charging is stopped (step 510), otherwise the measurement $VBP_{k+1}(I_B=0)$ is used to compute a new dynamic error voltage $\Delta V_{err,k+1}$ (step 512) and dynamic reference voltage $VBPH_{k+1}$ (step 514) and a new current pulse is initiated (step 516).

During each current pulse, the battery pack voltage at non-zero current $VBP(I_B=I_0)$ is sampled (step 518) and compared with the dynamic reference voltage computed at step 514. If the battery pack voltage at non-zero current has reached the dynamic reference voltage, the charging is stopped (step 520), otherwise the current pulse is maintained for the time Ton (steps 522). After the time Ton has lapsed, a new measurement of the battery pack voltage is taken $VBP(I_B=I_0)$ (step 524) and a new current pause is initiated (step 526). At the end of the current pulse (step 528) the process repeats.

The pulsed current applied in the burst mode phase 308 by the method 500 may have a different profile according to the type of battery being charged. For instance, powerful batteries having a large battery equivalent capacitance $C_B$ are charged more slowly than a battery with a significantly lower battery equivalent capacitance. So, for powerful battery with larger battery equivalent capacitance $C_B$ longer current pulses may be applied in the burst mode phase without any safety concern, since the battery cell voltage would not exceed the fixed reference voltage before the next sampling of the battery voltage at zero current.

The choice of the pulsed current profile is based on the type of battery and on the maximum value of the dynamic error voltage $\Delta V_{err}$ which is deemed acceptable from one current pause to the next. For example, a powerful battery of 4 A*h, charged with a constant current pulse of 4 A for 60 s, may increase its voltage by just 24 mV during the current pulse. Such a low voltage increment would be safe for the battery, even if it is in excess of the fixed reference voltage. For a less powerful battery of 1 A*h a lower pulse duration, for example 10 s, should be used, since higher values might generate a high $\Delta V_{err}$, which would not be safe.

In some embodiments, the method 500 may also include further steps in order to compute a new time tON after each current pause, the new tON value being based on the last measurement $VBP_k$ ($I_B=0$). The method 500 may be configured to gradually reduced the time tON when the measurement $VBP_k$ ($I_B=0$) approaches the fixed reference voltage (e.g. 4.2 V) in order to reduce the chance of the voltage VBP significantly exceeding the fixed reference voltage during the following current pulse.

Figure 6:
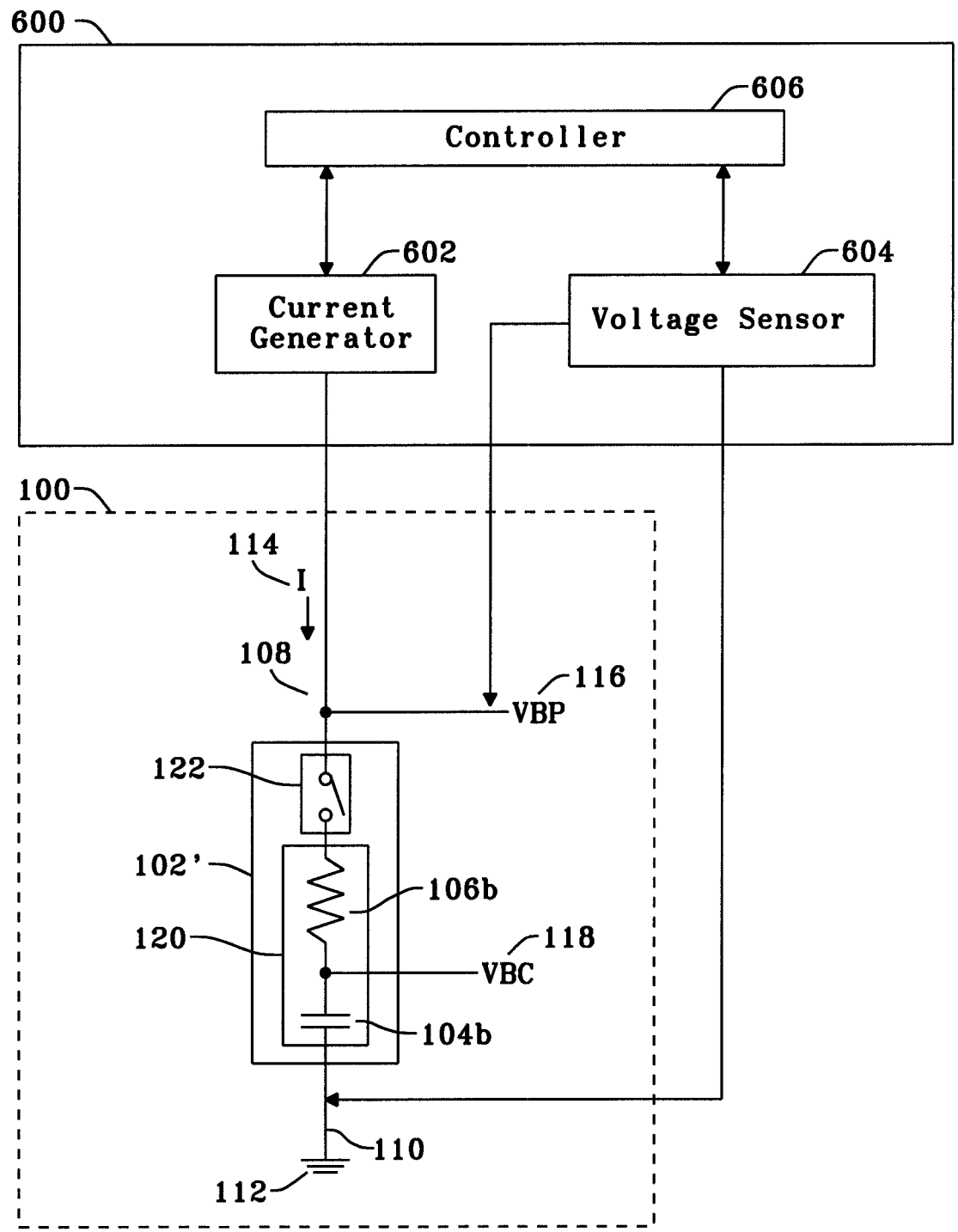
FIG. 6 is a schematic diagram of a charger for charging a battery according to the method of FIG. 2.

FIG. 6 is a schematic diagram of a charger 600 for charging a battery 100 having a first voltage 116 and a second voltage 118, according to the disclosure. Common features between figures in this disclosure are represented by common reference numerals/variables.

The charger 600 comprises a current generator 602 configured to provide a current 114 to the battery 100; a voltage sensor 604 configured to sample the first battery voltage 116; and a controller 606 configured to, in a first phase, apply a constant current to the battery 100 via the current generator 602; in a second phase, apply current pulses to the battery 100 via the current generator 602, the current pulses being separated by a current pause during which the current 114 is at or close to zero; provide a fixed reference voltage; repeat iteratively the steps of:
  sampling the first battery voltage 116 via the voltage sensor 604 during a current pulse to obtain a measurement of the first voltage:
  sampling the first battery voltage during a current pause via the voltage sensor 604 to obtain a measurement of the second voltage 118;
  generating a dynamic reference voltage based on the fixed reference voltage and on a difference between the measurement of the first voltage 116 and the measurement of the second voltage 118;
  comparing the measurement of the first voltage with the dynamic reference voltage;
and, stop applying the current pulses when at least one of the measurement of the first voltage is equal to the dynamic reference voltage and the measurement of the second voltage is equal to the fixed reference voltage.

It will be appreciated that the current generator and the voltage sensor may be implemented in any suitable way are not limited to any specific implementation.

In some embodiments, the charger 600 may be configured to execute the computer-implemented method 500. In particular, the charger 600 may comprise a sample-and-hold circuit 608 (not shown) to perform the sample and hold operations of the method 500. An example of analog sample-and-hold circuit for use in the charger 600 is shown in FIG. 7, though it will be appreciated that suitable sample-and-hold circuits may be implemented in many other ways, as will be known to the person skilled in the art.

Figure 7A:
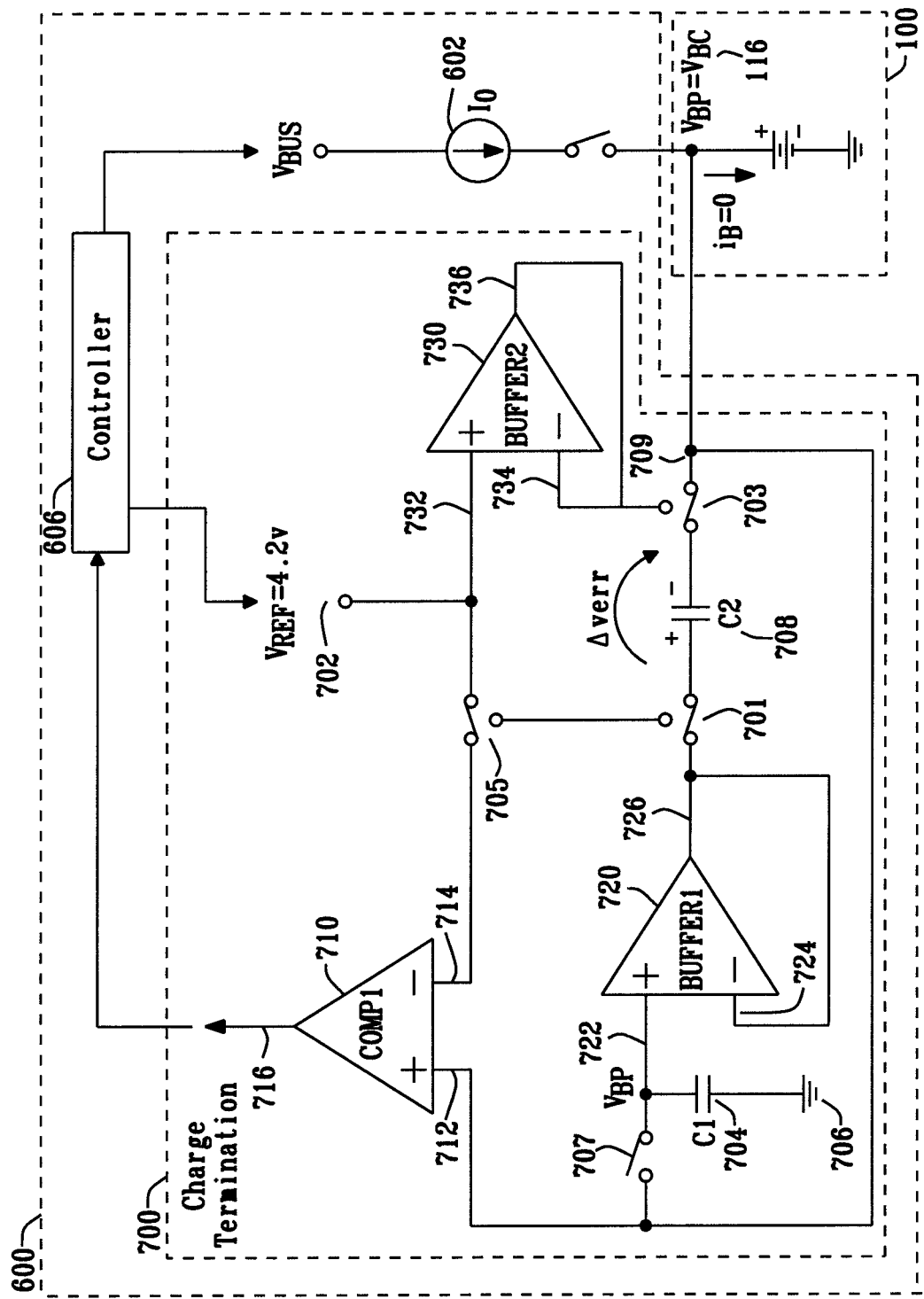
FIG. 7A is a schematic diagram of a specific embodiment of the charger of FIG. 6 during a current pause.
Figure 7B:
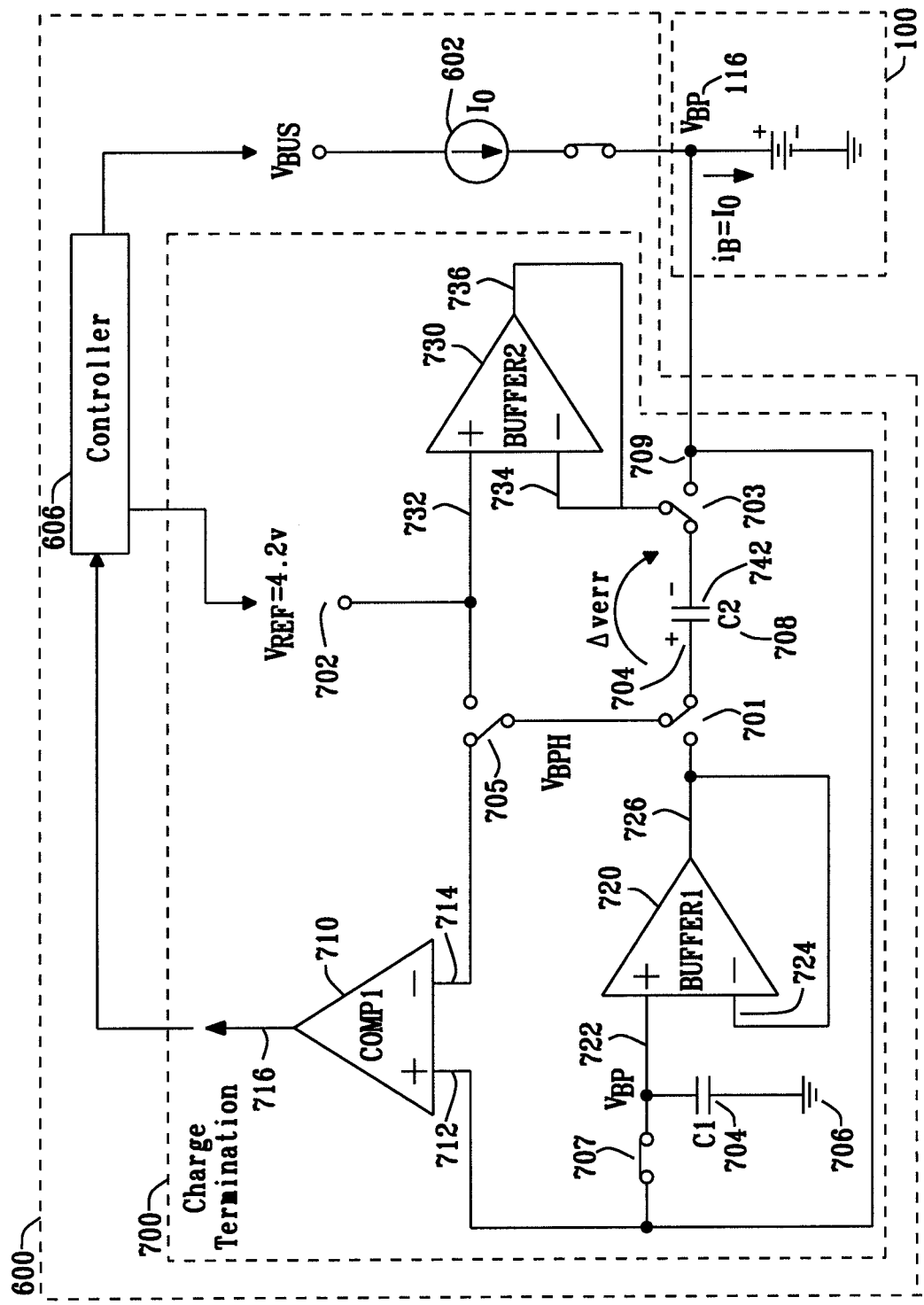
FIG. 7B is a schematic diagram of the embodiment of FIG. 7A during a current pulse.

FIG. 7A and FIG. 7B are schematic diagrams of a specific embodiment of the charger 600, wherein the charger 600 comprises a sample-and-hold circuit 700. FIG. 7A illustrates the charger 600 during a current pause. FIG. 7B illustrates the charger 600 during a current pulse. Common features between figures in this disclosure are represented by common reference numerals/variables.

The sample-and-hold circuit 700 is operable in one of two states and the controller 306 is configured to control the sample-and-hold circuit such that 700 during a current pause the sample-and-hold circuit 700 is in the first state; and during a current pulse the sample-and-hold circuit 700 is in the second state.

The sample-and-hold circuit 700 comprises a comparator 710, a first buffer 720 and a second buffer 730. The comparator 710 has first input 712, a second input 714 and an output 716. The first buffer 720 has a first input 722, a second input 724 and an output 726. The second buffer 730 has first input 732, a second input 734 and an output 736.

The sample-and-hold circuit 700 further comprises a first capacitor 704 which is coupled between the first input 722 of the first buffer 720 and a ground potential 706; and a second capacitor 708 which is coupled between a first switch 701 and a second switch 703. The first switch 701 is configured to be in either a first or a second state, wherein in the first state the switch 701 provides a coupling between the capacitor 708 and the output 726 of the first buffer 720; and in the second state the switch 701 provides a coupling between the capacitor 708 and the fixed reference voltage 702. The second switch 703 is configured to be either in a first or in a second state, wherein in the first state the switch 703 provides a coupling between the capacitor 708 and a circuit node 709 which is coupled to the first input 712 of the comparator 710 and to the battery pack voltage 116; and in the second state the switch 703 provides a coupling between the capacitor 708 and the second input 734 of the second buffer 730.

The first input 712 of the comparator 710 is coupled to the battery voltage pack 116 via the node 709. The second input 714 of the first comparator 710 is coupled to a third switch 705. The switch 705 may be for example a two-way switch. The switch 705 is configured to be in either a first or a second state, wherein the first state the switch 705 provides a coupling between the input 714 and the fixed reference voltage 702 and in the second state the switch 705 provides a coupling between the input 714 and the first switch 701. The output 716 of the comparator 710 is coupled to the controller 306.

The first input 722 of the first buffer 720 is coupled to a ground voltage 112 via the capacitor 706. Moreover, the first input 722 is coupled to the battery pack voltage 116 via a fourth switch 707 which is configured to be in either a first or a second state, wherein in the first state the switch 707 is open and in the second state the switch 707 is closed. The second input 724 of the first buffer 720 is coupled to the output 726 in a feedback loop.

The first input 732 of the second buffer 730 is coupled to the fixed reference voltage 702. The second input 734 of the second buffer 730 is coupled to the output 736 of the second buffer via a feedback loop.

The first buffer 720, the capacitor 704 and the capacitor 708 are configured to sample and hold the dynamic error voltage $\Delta V_{err}$. The second buffer 730 and the second capacitor 708, together with switches 703, 705 and 701, are configured to provide the sum of the fixed reference voltage and of the dynamic error voltage $\Delta V_{err}$.

During a current pause (FIG. 7A), the sample-and-hold circuit is in the first state and the switches 701, 703, 705 and 707 are in the first state. Hence the second input of the comparator is coupled to the fixed reference voltage 702. Since no current is flowing through the battery 100, the battery pack voltage 116 is equivalent to the battery cell voltage 118 and the comparator 710 provides an output signal which is based on the comparison between the battery cell voltage with the fixed reference voltage 702. The controller receives the output signal of the comparator 710 and triggers the termination of the charging if the battery cell voltage is equal to or greater than the fixed reference voltage.

During a current pulse (FIG. 7B), the sample-and-hold circuit 700 is in the second state and the switches 701, 703, 705 and 707 are in the second state. The second input 714 of the comparator 710 is coupled to the capacitor C2 and receives a sum of the fixed reference voltage and the dynamic error voltage $\Delta V_{err}$, that is the dynamic reference voltage VBPH. Hence, the comparator 710 provides an output signal which is based on the comparison between the battery pack voltage and the dynamic reference voltage VBPH. The controller receives the output signal of the comparator 710 and triggers the termination of the charging if the battery pack voltage is equal to or greater than the dynamic reference voltage.

In more detail, during a current pulse (FIG. 7B) the comparator C1 (704) is coupled to the battery via switch 707, hence the capacitor C1 is charged to the voltage of the battery during a current pulse $VBP(I_B=I_0)$. During the following current pause (FIG. 7A) the switches 701 and 703 connect the second capacitor C2 (708) to the buffer 720 and to the voltage VBP (116) of the battery (now at zero current). A voltage equal to $\Delta V_{err}$ is built-up on the second capacitor C2 (708) as a difference between the voltage $VBP(I_B=I_0)$ and the last voltage $VBP(I_B=0)$ sampled during the previous current pulse which is stored on C1 and provided to C2 during the current pause via buffer 720. During the following current pulse (FIG. 7B), a positive terminal 740 of the capacitor C2 (708) is disconnected from the buffer 720 and coupled to the input 714 of the comparator 710 via switches 701 and 705; a negative terminal 742 of the capacitor C2 is disconnected from the battery and coupled to the buffer 730 via switch 703. The second buffer 730 applies the fixed reference voltage 702 to the negative terminal of C2, such that a voltage equal to the sum of the fixed reference voltage 702 and the extracted dynamic error voltage $\Delta V_{err}$ is provided to the input 714 of the comparator 710.

It will be appreciated that the sample-and-hold circuit of FIG. 7 may be replaced by any other suitable sample-and-hold circuit, such as a purely digital circuit or a complex circuit comprising an analog to digital converter (ADC) and a processor.

Figure 8:
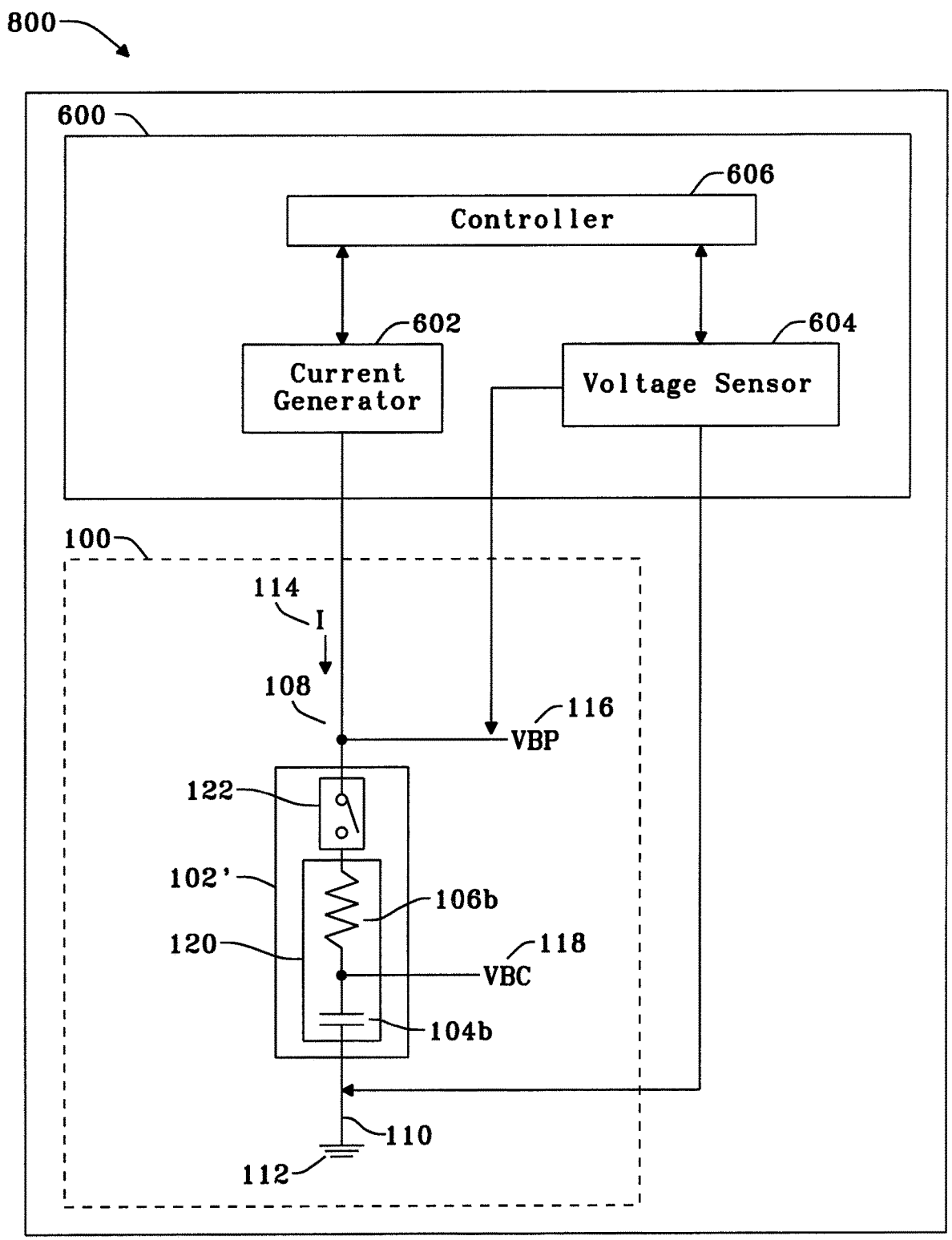
FIG. 8 is a schematic diagram of a device comprising the charger of FIG. 5.

FIG. 8 is a schematic diagram of a device comprising the charger of FIG. 6. Common features between figures in this disclosure are represented by common reference numerals/variables.

The device 800 may be any user electronic device comprising a rechargeable battery 100 or configured to be used in combination with a battery 100. The charger 600 is configured to operate as previously described with reference to FIGS. 2 through 7.

Prior art charging methods do not provide a dynamic reference voltage. They either use the battery nominal voltage or a predetermined voltage given by nominal or empirical battery parameters estimated prior to charging in order to determine when to stop applying the charging current. However, this can lead to an overvoltage, which is a safety concern, or to an undervoltage, which means incomplete charge, since the battery parameters are not constant throughout charging. The methods and system of the present disclosure solve this problem by using a dynamic reference voltage which takes into account the real-time value of the battery parameters throughout charging.

Instead of increasing the charging current during the constant current phase in order to accelerate charging and then applying a constant voltage phase and charging termination, the method and systems according to the present disclosure allow to accelerate charging whilst maintaining the same or a lower current during the constant current mode and then applying a pulsed current or burst mode phase. Pulsed current charging may be easily implemented in any traditional charging system, and so the methods and systems according to the present disclosure provide backwards compatibility with virtually all existing charging systems.

The methods and systems according to the present disclosure allow to achieve fast charging without having to increase the charging current used throughout the charging process, thereby eliminating the need of a trade-off between fast charging and battery life, which is a problem affecting most prior art charging systems. Compared with prior art systems, the methods and systems according to the present disclosure allow either faster charging at similar current levels, that is, faster charging with a similar battery life; or, they allow similar charging times at lower current levels, that is, same speed of charging with a longer battery life.

The methods and systems according to the present disclosure also enable a significant reduction of silicon area compared to most existing charging methods and systems. For example, methods which accelerate charging by increasing the current applied during the constant-current phase may only achieve limited silicon area reduction due to the size of the power FETs which are used on the charging path, since higher currents require larger FETs. Since the methods and systems of the present disclosures achieve faster charging without having to increase the current applied in the constant current phase, smaller FETs may be used and an area reduction of more than 50% may be achieved.

In conclusion, the methods and systems according to the present disclosure allow true full charging of a battery whilst maximizing charging speed, maximizing battery life, eliminating safety concerns and minimizing charger size.

Various improvements and modifications may be made to the above without departing from the scope of the disclosure.

What is claimed is:

1. A method of charging a battery having a first voltage and a second voltage, the method comprising
    in a first phase, applying a constant current to the battery;
    in a second phase, applying current pulses to the battery, the current pulses being separated by a current pause during which the current is at or close to zero;
    providing a fixed reference voltage;
    repeating iteratively
        sampling the first voltage during a current pulse to obtain a measurement of the first voltage;
        sampling the first voltage during a current pause to obtain a measurement of the second voltage;
        generating a dynamic reference voltage based on the fixed reference voltage and on a difference between the measurement of the first voltage and the measurement of the second voltage;
        comparing the measurement of the first voltage with the dynamic reference voltage;
    stop applying the current pulses when at least one of the measurement of the first voltage is equal to the dynamic reference voltage and the measurement of the second voltage is equal to the fixed reference voltage.

2. The method as claimed in claim 1, wherein the method further comprises iteratively comparing the measurement of the second voltage with the fixed reference voltage.

3. The method as claimed in claim 1, wherein the battery comprises a battery pack and wherein the first voltage is a voltage of the battery pack.

4. The method as claimed in claim 1, wherein the dynamic reference voltage is the sum of the fixed reference voltage and a dynamic error voltage, the dynamic error voltage being determined as the difference between the last measurement of the first voltage and the last measurement of the second voltage.

5. The method as claimed in claim, 1 wherein iteratively sampling the first battery voltage during a current pause comprises one of
    sampling the first battery voltage during each current pause; and
    sampling the first battery voltage during the first available current pause after a predetermined time interval has lapsed.

6. The method as claimed in claim 1, wherein the current pulses have a constant profile.

7. The method as claimed in claim 6, wherein the constant profile is a square profile.

8. The method as claimed in claim 1, wherein the amplitude of the current pulses is equal to an amplitude of the constant current applied to the battery during the first phase.

9. The method as claimed in claim 1, wherein the duration of the current pauses is selected based on a relaxation time of the battery.

10. The method as claimed in claim 1, wherein the duration of the current pulses is selected based on an average time required for the dynamic error voltage to vary by a predetermined amount.

11. The method as claimed in claim 1, wherein the method further comprises:
    applying a pulsed current to the battery prior to the first phase, upon identifying that the battery is fully depleted.

12. A charger for charging a battery having a first voltage and a second voltage, the charger comprising
    a current generator to provide a current to the battery;
    a voltage sensor to sample the first battery voltage; and
    a controller configured to
        in a first phase, apply a constant current to the battery via the current generator;
        in a second phase, apply current pulses to the battery via the current generator, the current pulses being separated by a current pause during which the current is at or close to zero;
        provide a fixed reference voltage;
        repeat iteratively
            sampling the first voltage via the voltage sensor during a current pulse to obtain a measurement of the first voltage;

sampling the first voltage via the voltage sensor during a current pause to obtain a measurement of the second voltage;

generating a dynamic reference voltage based on the fixed reference voltage and on a difference between the measurement of the first voltage and the measurements of the second voltage;

comparing the measurement of the first voltage with the dynamic reference voltage;

stop applying the current pulses when at least one of the measurement of the first voltage is equal to the dynamic reference voltage and the measurement of the second voltage is equal to the fixed reference voltage.

13. The charger as claimed in claim 12, wherein the dynamic reference voltage is the sum of the fixed reference voltage and a dynamic error voltage, the dynamic error voltage being determined as the difference between the last measurement of the first voltage and the last measurement of the second voltage.

14. The charger as claimed in claim 13, wherein the charger comprises a sample-and-hold circuit being operable in one of a first state and a second state; and the controller is further configured to control the sample-and-hold circuit such that during a current pause, the sample-and-hold circuit is in the first state; and during a current pulse the sample-and-hold circuit is in the second state.

15. The charger as claimed in claim 14, wherein the sample-and-hold circuit is an analog circuit.

16. The charger as claimed in claim 14, wherein the sample-and-hold circuit comprises a comparator having an output coupled to the controller; and the sample-and-hold circuit is configured such that in the first state, the output of the comparator is a signal based on a comparison between the measurement of the first voltage and the fixed reference voltage; and in the second state, the output of the comparator is a signal based on a comparison between the measurement of the second voltage and the dynamic reference voltage.

17. The charger as claimed in claim 16, wherein the sample-and-hold circuit further comprises a first capacitor, a second capacitor and a first buffer, the buffer begin coupled between the first and the second capacitor; and a second buffer;

wherein the first buffer, the first capacitor and the second capacitor are configured to sample and hold the dynamic error voltage; and the second buffer and the second capacitor are configured to provide to the comparator a sum of the sampled dynamic error voltage and the fixed reference voltage.

18. A device comprising a charger for charging a battery having a first voltage and a second voltage, the charger comprising a current generator configured to provide a current to the battery;

a voltage sensor configured to sample the first battery voltage; and a controller configured to in a first phase, apply a constant current to the battery via the current generator;

in a second phase, apply current pulses to the battery via the current generator, the current pulses being separated by a current pause during which the current is at or close to zero;

provide a fixed reference voltage;

repeat iteratively sampling the first voltage via the voltage sensor during a current pulse to obtain a measurement of the first voltage;

sampling the first voltage via the voltage sensor during a current pause to obtain a measurement of the second voltage;

generating a dynamic reference voltage based on the fixed reference voltage and on a difference between the measurement of the first voltage and the measurements of the second voltage;

comparing the measurement of the first voltage with the dynamic reference voltage;

stop applying the current pulses when at least one of the measurement of the first voltage is equal to the dynamic reference voltage and the measurement of the second voltage is equal to the fixed reference voltage.

* * * * *